United States Patent
Park

(10) Patent No.: US 7,086,871 B2
(45) Date of Patent: Aug. 8, 2006

(54) BENT WAFER AND PCB ASSEMBLY FOR REFRIGERATOR PROVIDED WITH THE SAME

(75) Inventor: Jong-Sik Park, Gyeongsangnam-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/960,969

(22) Filed: Oct. 12, 2004

(65) Prior Publication Data
US 2005/0085108 A1    Apr. 21, 2005

(30) Foreign Application Priority Data
Oct. 20, 2003    (KR) .................. 10-2003-0073122

(51) Int. Cl.
*H01R 12/00*    (2006.01)
(52) U.S. Cl. ..................................... 439/78
(58) Field of Classification Search .............. 439/83, 439/79, 660, 76.2, 78
See application file for complete search history.

(56) References Cited

U.S. PATENT DOCUMENTS 5,380,222 A  *  1/1995  Kobayashi .................. 439/590

* cited by examiner

*Primary Examiner*—Tho D. Ta
*Assistant Examiner*—Vanessa Girardi
(74) *Attorney, Agent, or Firm*—Birch, Stewart, Kolasch & Birch, LLP

(57) ABSTRACT

A bent wafer and a PCB assembly for a refrigerator provided with the same includes a bent wafer including a wafer body formed in a bent shape and a plurality of pin terminals coupled to the wafer body and a PCB having a quadrangular shape, on which wafer including the bent wafer are mounted, thereby compactly mounting the wafer on the PCB, relatively reducing a size of the PCB, and reducing the number of assembling processes for mounting the wafer on the PCB.

9 Claims, 4 Drawing Sheets

BENT WAFER AND PCB ASSEMBLY FOR REFRIGERATOR PROVIDED WITH THE SAME

This Nonprovisional application claims priority under 35 U.S.C. § 119(a) on Patent Application No(s). 10-2003-0073122 filed in Korea, Republic of on Oct. 20, 2003, the entire contents of which are hereby incorporated by reference.

BACKGROUND OF THE INVENTION

1. Field of the Invention

The present invention relates to a refrigerator, and more particularly, to a bent wafer and a PCB assembly for a refrigerator provided with the same capable of compactly mounting wafers on a PCB mounted to a refrigerator body and relatively decreasing a size of the PCB.

2. Description of the Background Art

In general, a refrigerator maintains a freezing chamber and a chilling chamber in a cold state as a refrigerating cycle system is mounted therein, an evaporator constructing a refrigerating cycle system generates cool air, and the cool air circulates in the freezing chamber and the chilling chamber. A user puts food items in the freezing chamber and the chilling chamber.

The refrigerator includes a refrigerator body commonly provided with a freezing chamber and a chilling chamber; and a door mounted at the refrigerator body, for opening and closing the two chambers. Also, a control unit is provided at one side of the refrigerator body, wherein the control unit controls operation of a refrigerating cycle system according to a load of the freezing or chilling chamber and also controls temperatures of the two chambers.

The control unit includes a plurality of PCBs provided with wafers.

As known, the PCB is made by forming a circuit made of a conductive material on or in an insulation substrate having a predetermined size. The PCBs are classified according to configuration of the circuit. For example, the PCBs are classified into a single layer PCB in which a circuit is formed at one side surface of the insulation substrate, a double layer PCB in which circuits are formed at both side surfaces of the insulation substrate, respectively, and a multi-layer PCB in which a plurality of circuits are formed in the insulation substrate.

FIG. 1 is a plan view showing a-PCB for a refrigerator provided with a conventional wafers, and FIG. 2 is a perspective view showing a partially-exploded PCB for a refrigerator provided with the wafers.

As shown, the PCB for a refrigerator provided with the wafers is comprised of a PCB 100 having a quadrangular shape and a plurality of wafers 200 mounted on the PCB 100.

The PCB 100 is formed by forming a plurality of coupling holes on an insulation substrate 100 where a circuit is formed.

The wafer 200 includes a body 210 having a rectangular shape and made of an insulation material and a plurality of pin terminals 220 made of a conductive body and penetratingly coupled to the body 210. The body 210 includes a quadrangular container portion 211 with four sides; a pin-coupled surface portion 212 for covering one side of the quadrangular container portion 211; and pin holes (not shown) penetratingly formed at the pin-coupled surface portion 212 and coupled to the pin terminals 220. A plurality of pin terminals 220 are fixedly coupled to the pin holes, respectively.

The wafers 200 are coupled to the substrate 110 such that their pin terminals 220 are inserted in the coupling holes 120 of the substrate to thereby be connected to a circuit of the substrate 110. When each wafer 200 is coupled to the substrate 110, an opened portion of its body 210 is located at an upper side. The pin terminals 220 coupled to the substrate 110 are fastened to the substrate 110 by soldering or the like.

Plugs connected to each load are coupled to the wafers 200 mounted on the PCB 100 in the above-mentioned manner, respectively. Each plug is coupled to the wafer 200 by being inserted into the opened portion of the wafer body 210.

However, because the wafers 200 are formed in a straight shape on the PCB for a refrigerator provided with the above-described conventional wafers, the wafers 200 cannot be compactly assembled when being mounted on a corner portion of the PCB 100. For this reason, disadvantageously, integration efficiency of the wafers 200 mounted to the PCB 100 becomes low, and the size of the PCB 100 becomes relatively large. Namely, as shown in FIG. 1, because each wafer 200 is formed in a straight shape, in case of mounting the wafers 200 on a corner of the PCB 100, two wafers 200 should be mounted at a right angle to each other. For this reason, the PCB 100 is undesirably lengthened as long as L1 and/or L2 in a longitudinal direction or widened as wide as W1 and/or W2, thereby degrading integration efficiency of the wafers.

Accordingly, a manufacturing cost of the PCB 100 is relatively increased, and the size of the PCB becomes large and is not compact, whereby the PCB undesirably occupies a large space when installed in a refrigerator body and is restricted by its installation space.

SUMMARY OF THE INVENTION

Therefore, an object of the present invention is to provide a bent wafer and a PCB assembly for a refrigerator provided with the same capable of compactly mounting wafers on a PCB and relatively decreasing the size of the PCB.

Another object of the present invention is to provide a bent wafer and a PCB assembly for a refrigerator provided with the same capable of decreasing the number of assembling processes for mounting a wafer on a PCB.

To achieve these and other advantages and in accordance with a purpose of the present invention, as embodied and broadly described herein, there is provided A bent wafer comprising: a wafer body formed in a bent shape; and a plurality of pin terminals 320 coupled to the wafer body.

To achieve these and other advantages and in accordance a the purpose of the present invention, as embodied and broadly described herein, there is provided a PCB assembly for a refrigerator provided with a bent wafer comprising: a PCB formed in a quadrangular shape; and wafers mounted on the PCB and including a bent wafer formed in a bent shape.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
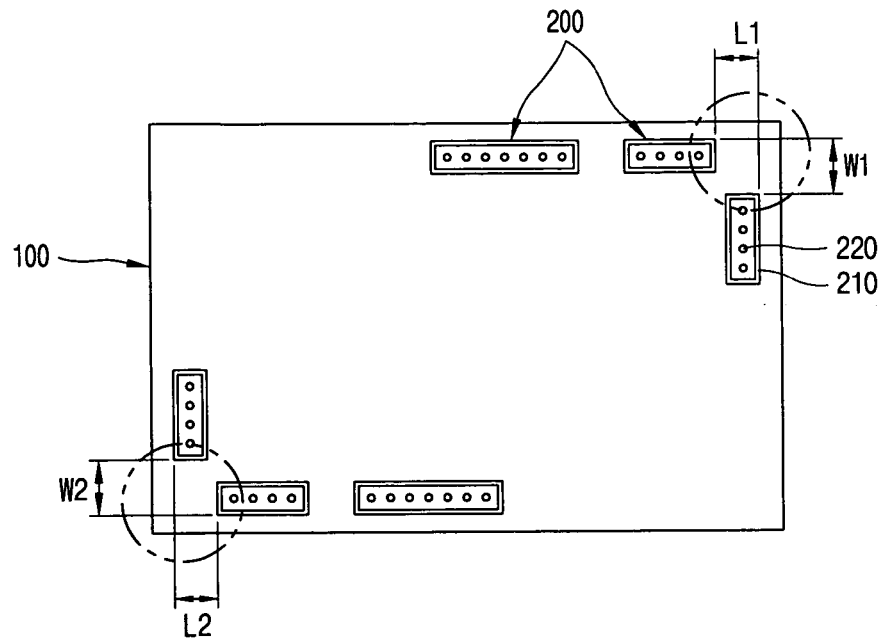
FIG. 1 is a plan view showing a PCB for a refrigerator provided with a conventional wafer.
Figure 2:
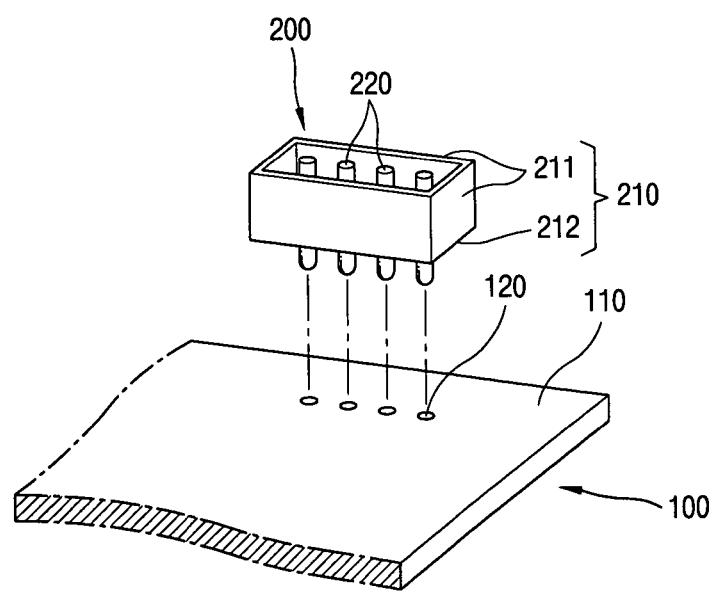
FIG. 2 is a perspective view showing a partially exploded PCB for a refrigerator provided with the wafer.
Figure 3:
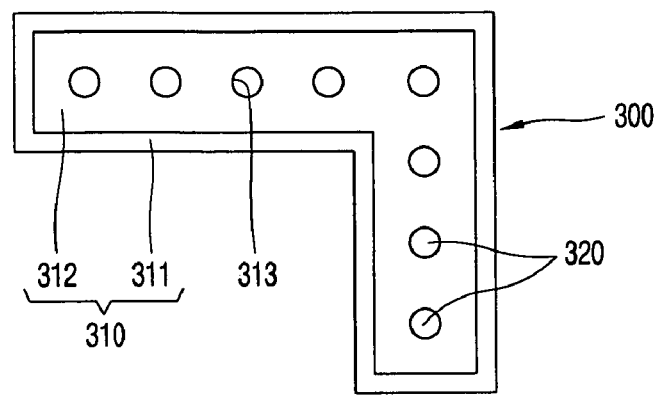
FIGS. 3 and 4 are plan view and perspective view showing a bent wafer in accordance with an embodiment of the present invention.
Figure 4:
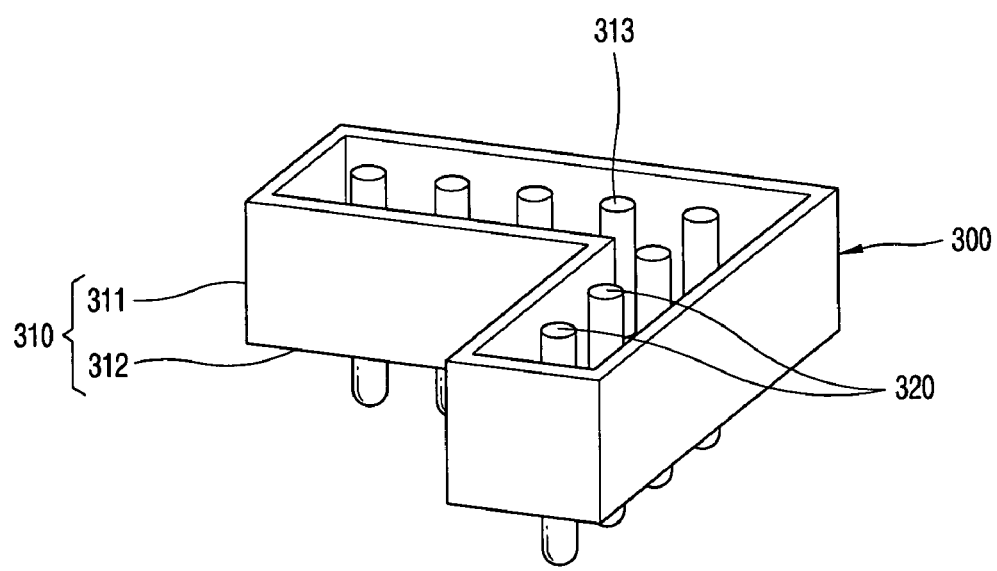

FIG. 3 is a plan view showing a bent wafer in accordance with an embodiment of the present invention, and FIG. 4 is a perspective view showing the bent wafer.

As shown, the bent wafer 300 in accordance with an embodiment of the present invention includes a wafer body 310 formed in a bent shape; and a plurality of pin terminals coupled to the wafer body 310. The wafer body 310 is made of an insulating material, and the plurality of pin terminals 320 are made of a conductive material through which a current may flow.

The wafer body 310 includes: a bent body portion 311 formed in a bent shape at a right angle; a bent support portion 312 extendingly formed at one side of the bent body portion 311 to cover the one side; and a plurality of pin holes 313 penetratingly formed at the bent support portion 312 so that the pin terminals 320 are fixedly coupled thereto. Preferably, a thickness and a width of the bent body portion 311 are constant.

The pin holes 313 are arranged as a curved shape according to a shape of the bent support portion 312. Preferably, the pin holes 313 are formed at regular intervals along a central line of the bent support portion 312.

Each pin terminal 320 is formed in a pin shape with a certain length and section. Each pin terminal 320 is fixedly coupled to the wafer body 310 so that its one side protrudes outside the bent support portion 312 and the other side is located inside the bent body portion 311.

Figure 5:
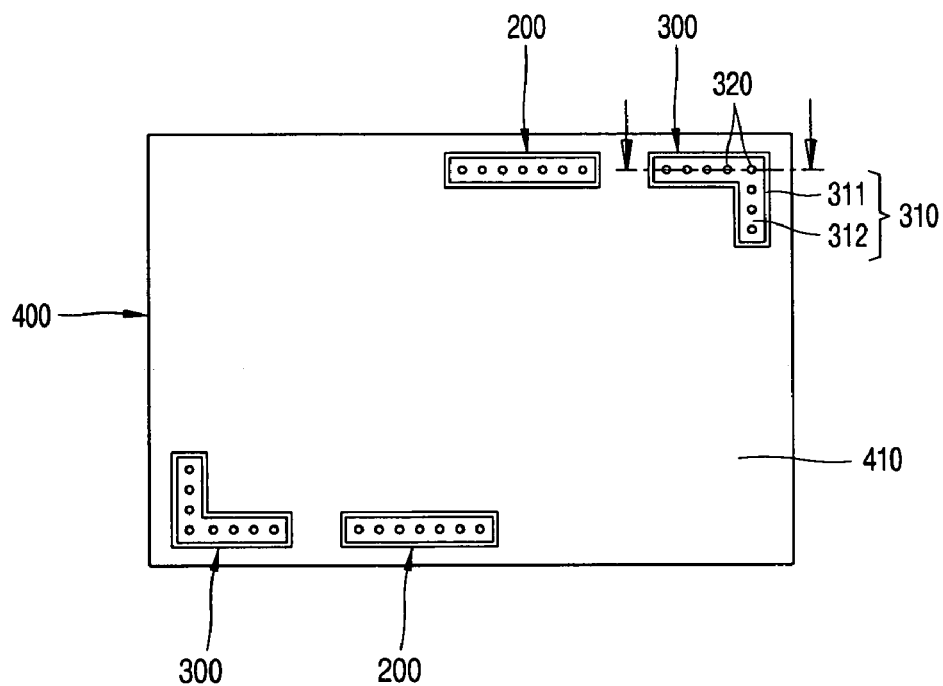
FIG. 5 is a plan view showing a PCB assembly for a refrigerator provided with a bent wafer in accordance with an embodiment of the present invention.
Figure 6:
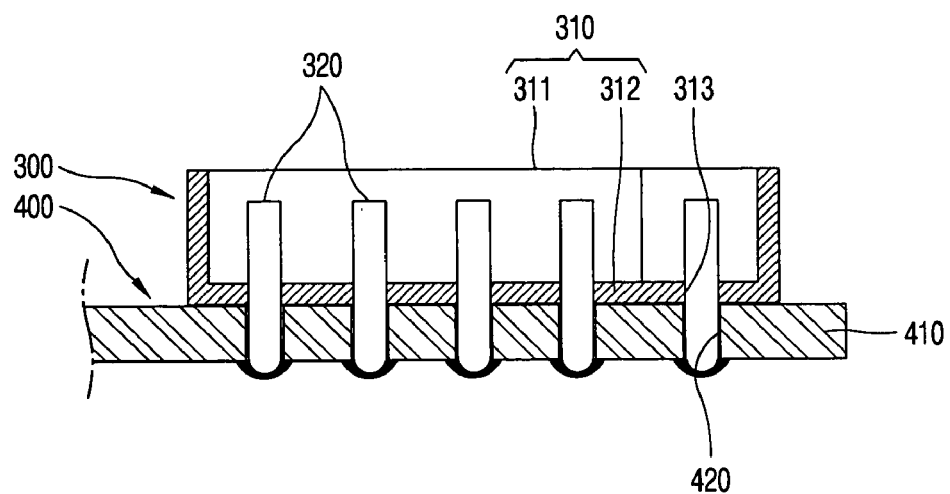
FIG. 6 is a sectional view showing a partially sectioned PCB assembly for a refrigerator provided with the bent wafer.

FIG. 5 is a plan view showing a PCB assembly for a refrigerator provided with a bent wafer in accordance with an embodiment of the present invention, and FIG. 6 is a sectional view showing a partially sectioned PCB assembly for a refrigerator provided with the bent wafer.

As shown, the PCB assembly for a refrigerator provided with the bent wafer is formed by mounting wafers 200 including a bent wafer 300 on a PCB 400 having a quadrangular shape.

The PCB 400 is formed by forming on an insulation substrate 410 a predetermined-shaped circuit (not shown) and coupling holes 420 into which the wafers 200, 300 are mounted.

The bent wafer 300 includes a wafer body 310 formed in a bent shape; and a plurality of pin terminals 320 coupled to the wafer body 310.

The wafer body 310 includes a bent body portion 311 formed in a bent shape at a right angle; a bent support portion 312 covering one side of the bent body portion 311; and a plurality of pin holes 313 penetratingly formed at the bent support portion 312 so that the pin terminals 320 are fixedly coupled thereto. Preferably, a thickness and a width of the bent body portion 311 are constant.

The pin holes 313 are arranged as a curved shape according to a shape of the bent support portion 312. Preferably, the pin holes 313 are formed at regular intervals along a central line of the bent support portion 312.

The wafer body 310 is made of an insulation material, and the pin terminal 320 is made of a conductive material through which a current flows.

The bent wafer 300 is mounted on at least two corners of corners of the PCB 400.

Because the PCB 400 has a quadrangular shape, its corner is at a right angle. When mounted on the PCB 400, the bent wafer 300 is positioned corresponding to a shape of the corner of the PCB.

The bent wafer 300 is mounted on the PCB 400 by inserting its pin terminals 320 in pin holes 313 of the PCB and is fastened thereto by soldering of the pin terminals 320 of the bent wafer 300 mounted on the PCB 400, or the like.

Non-explained reference numeral 500 is a plug, and 600 is a lead line connecting the plug to a load.

Hereinafter, operational effect of a bent wafer and a PCB assembly for a refrigerator provided with the same will now be described.

Figure 7:
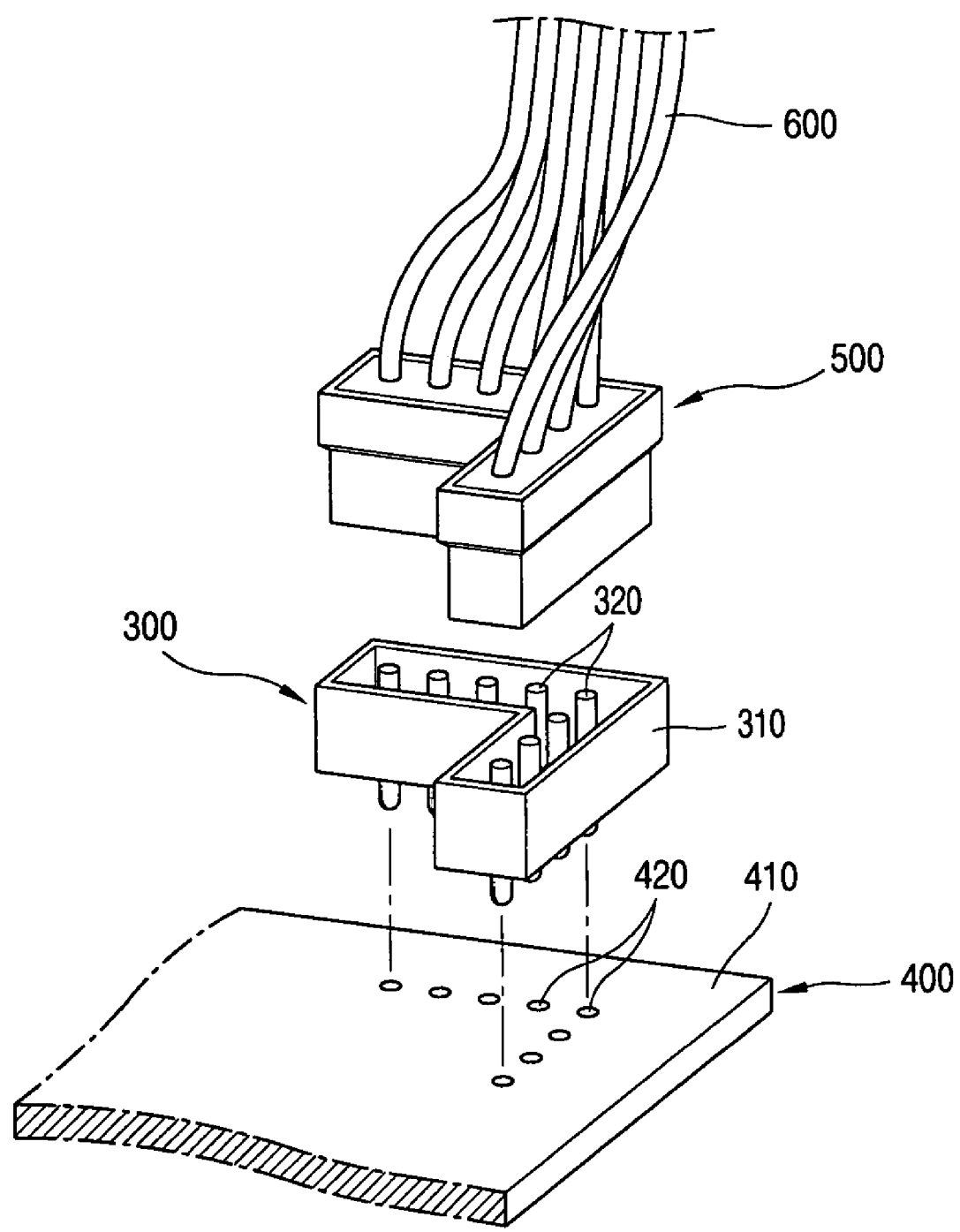
FIG. 7 is a perspective view showing a partially exploded PCB assembly for a refrigerator provided with the beat wafer.

As shown in FIG. 7, a plug 500 connected to a load is inserted in the bent wafer 300 mounted on the PCB to be connected thereto. Both straight and bent plugs may be connected to the bent wafer 300, and the bent plug has a shape corresponding to the bent wafer 300. When the straight plug is connected to the bent wafer 300, two straight plugs are positioned at a right angle as if one bent plug, thereby being connected to the bent wafer 300.

In the present invention, a wafer is formed in a bent shape, and the bent wafer 300 is mounted on a corner portion of the PCB 400, thereby utilizing the corner region of the PCB 400 as much as possible and thus improving integration efficiency of the wafers. Namely, in the present invention, the wafer is formed in a shape corresponding to the corner of the PCB 400, so that an entire region of the PCB 400 can be utilized efficiently, and integration efficiency is improved, unlike the conventional structure in which because each wafer 200 is formed in a straight shape, the waters 200 cannot be compactly integrated in a corner region of the PCB 100, thereby degrading utilization of an entire size of the PCB.

Also, the integration efficiency of the wafer mounted on the PCB 400 is improved, and thus the size of the PCB 400 is relatively reduced, so that the wafer is easily installed on the PCB 400, only occupying a small area of the PCB 400. In addition, a manufacturing cost is reduced because of a size decrease of the PCB, thereby improving competitive power of a product.

Also, because the wafer 300 according to the present invention is formed in a bent shape as if two straight wafers coupled at a right angle, mounting one bent wafer 300 is like mounting two straight wafers 200, thereby reducing an assembly process of the wafer and thus improving productivity in assembling.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A bent wafer comprising:
   a wafer body having a bent body portion integrally formed with a bent support portion resulting in a single L-shaped rectangular recess adapted to receive and enclose a portion of a plug; and
   a plurality of electrical pin terminals coupled to and at least partially located within the recess of the wafer body.

2. The bent wafer of claim 1, wherein the wafer body further comprises:
   a plurality of pin holes penetratingly formed at the bent support portion, to which the plurality of pin terminals are fixedly coupled.

3. The bent wafer of claim 2, wherein the pin holes are arranged as a bent shape according to a shape of the bent support portion.

4. A printed circuit board assembly for a refrigerator provided with a bent wafer comprising:
   a printed circuit board (PCB) formed in a quadrangular shape; and
   wafers mounted on the PCB and including a wafer body having a bent body portion integrally formed with a bent support portion that form a single L-shaped rectangular recess adapted to receive and enclose a portion of a plug.

5. The assembly of claim 4, wherein the bent wafer is mounted on at least two corners of corners of the PCB.

6. The assembly of claim 5, wherein the bent wafer is positioned corresponding to a shape of a corner of the PCB.

7. The assembly of claim 4, wherein the wafer body comprises:
   a plurality of pin terminals coupled to the wafer body.

8. The assembly of claim 7, wherein the wafer body comprises:
   a plurality of pin holes penetratingly formed at the bent support portion, to which the plurality of pin terminals are fixedly coupled.

9. The assembly of claim 8, wherein the pin holes are arranged as a bent shape according to a shape of the bent portion.

\* \* \* \* \*